United States Patent [19]

Ushijima et al.

[11] Patent Number: 5,089,305
[45] Date of Patent: Feb. 18, 1992

[54] COATING APPARATUS AND METHOD FOR APPLYING A LIQUID TO A SEMICONDUCTOR WAFER INCLUDING SELECTING A NOZZLE ON A STAND BY STATE

[75] Inventors: Mitsuru Ushijima, Tama; Osamu Hirakawa, Kumamoto; Masami Akimoto, Kikuyo; Yoshio Kimura, Taimei; Noriyuki Anai, Kumamoto, all of Japan

[73] Assignees: Tokyo Electron Limited, Tokyo; Tel Kyushu Limited, Kumamoto, both of Japan

[21] Appl. No.: 585,199

[22] Filed: Sep. 20, 1990

Related U.S. Application Data

[62] Division of Ser. No. 357,279, May 26, 1989, Pat. No. 5,002,008.

[30] Foreign Application Priority Data

May 27, 1988 [JP] Japan .................................. 63-130723
Jul. 1, 1988 [JP] Japan .................................. 63-164245

[51] Int. Cl.$^5$ .............................................. B05D 1/30
[52] U.S. Cl. .................................... 427/422; 427/425; 118/52; 118/600; 118/302; 118/321
[58] Field of Search ........... 427/426, 422, 425; 118/302, 313, 321, 411, 600, 52

[56] References Cited

U.S. PATENT DOCUMENTS

| | | | |
|---|---|---|---|
| 691,075 | 1/1902 | Riguad | 118/313 |
| 3,908,592 | 9/1975 | Ordway et al. | 118/313 |
| 4,416,213 | 11/1983 | Sakiya | 118/302 X |
| 4,564,280 | 1/1986 | Fukuda | 118/321 X |
| 4,872,417 | 10/1989 | Kunabara et al. | 118/411 X |
| 4,886,012 | 12/1989 | Ikeno et al. | 118/52 X |
| 4,932,353 | 6/1990 | Kawata et al. | 118/52 X |

FOREIGN PATENT DOCUMENTS

0301521 12/1988 Japan .................................. 118/52

*Primary Examiner*—Shrive Beck
*Assistant Examiner*—Alain Bashore
*Attorney, Agent, or Firm*—Oblon, Spivak, McClelland, Maier & Neustadt

[57] ABSTRACT

Disclosed is a coating apparatus for applying a resist or developing solution to a semiconductor wafer. This coating apparatus comprises a plurality of nozzles supplied with various resist from a resist source and each adapted to drip the different solution onto the wafer, a vessel in which the nozzles is kept on stand-by, while maintaining the liquids in a predetermined state in the vicinity of discharge port portions of the nozzles, when the nozzles need not be operated, and a nozzle operating mechanism for selecting one of the nozzles kept on stand-by in the vessel, and transporting the selected nozzle to the location of the wafer, whereby the resist is applied to the wafer by means of only the nozzle transported by the nozzle operating mechanism.

6 Claims, 8 Drawing Sheets

PRIOR ART

F I G. 1

PRIOR ART

F I G. 2

PRIOR ART

COATING APPARATUS AND METHOD FOR APPLYING A LIQUID TO A SEMICONDUCTOR WAFER INCLUDING SELECTING A NOZZLE ON A STAND BY STATE

This is a division of application Ser. No. 07/357,279, filed on May 26, 1989, now U.S. Pat. No. 5,002,008.

BACKGROUND OF THE INVENTION

1. Field of the Invention

The present invention relates to a coating apparatus and method for applying a liquid to a semiconductor wafer, and more particularly to the mechanism of nozzles for supplying a resist or developing solution for coating onto a semiconductor wafer.

2. Description of the Related Art

As the integration degree of semiconductor devices, such as ICs and LSIs, is increasing, working processes tend to be subdivided. Accordingly, a coating process for applying a resist to a semiconductor wafer and a developing process are complicated.

A spin coater is conventionally used in the resist and developer coating processes. To fulfill requirements of the complicated coating processes, the spin coater is provided with a plurality of liquid supply nozzles. More specifically, one and the same coater is provided with a plurality of resist supply nozzles (for high-resolution resists, dye-mixed resists, resists with high thermal resistance, etc.) and a nozzle for the supply of a developing solution. A required one of the nozzles is selected corresponding to each process by means of a nozzle operating mechanism, and a desired liquid is dripped from the selected nozzle onto a semiconductor wafer.

Figure 1:
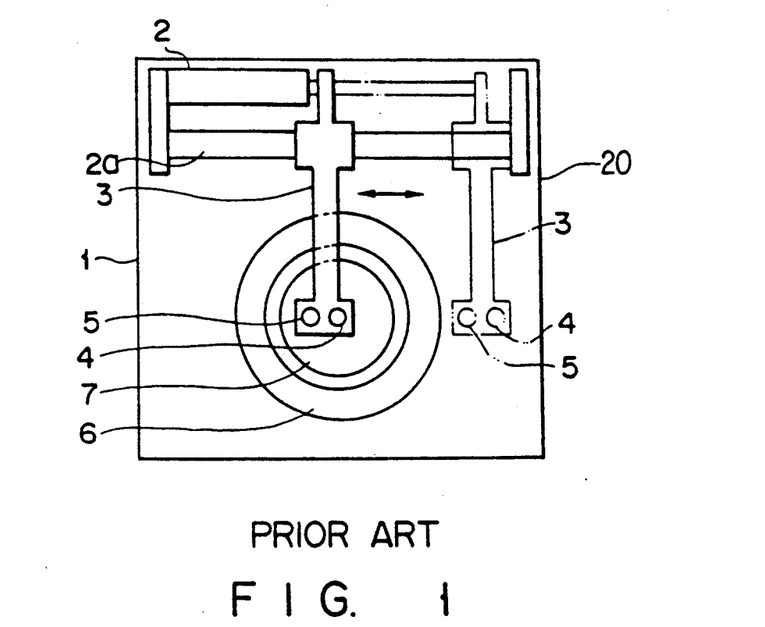
FIG. 1 is a plan view schematically showing a prior art coating apparatus.

In a prior art coating apparatus, as shown in FIG. 1, air cylinder 2 and guide 2a are arranged on base 20 so as to extend along the surface of the base. A rod of cylinder 2 is coupled to one end portion of arm 3, while two nozzles 4 and 5 are attached to the other end portion (distal end portion) of the arm.

When nozzles 4 and 5 need not be operated, in this conventional apparatus, arm 3 is moved to one side of base 1, where it is kept on stand-by at a stand-by position, as indicated by two-dot chain line in FIG. 1. When nozzle 4 or 5 is expected to be operated, arm 3 is moved toward the center of base 1 so that nozzle 4 or 5 is situated directly over the center position of semiconductor wafer 7. Wafer 7 is retained by means of a wafer chuck (not shown) which is located inside cup 6. Arm 3 is stopped at a predetermined position, and a predetermined amount of resist is supplied (e.g., dripped or jetted) from, e.g., nozzle 4 onto the center position of wafer 7. Then, semiconductor wafer 7 is rotated to disperse the resist uniformly over the whole surface of the wafer. One of nozzles 4 and 5 is alternatively selected by controlling the stop position of arm 3.

In the coating apparatus described above, however, there is a possibility of the resist unexpectedly falling from the nonoperating nozzle (e.g., nozzle 5) onto the semiconductor wafer. Moreover, the resist may possibly be dried in the liquid passage of the unused nozzle, so that viscosity of the liquid increases too much for even coating. Thus, a resist layer with a desired uniform thickness cannot be formed on the surface of the wafer.

Figure 2:
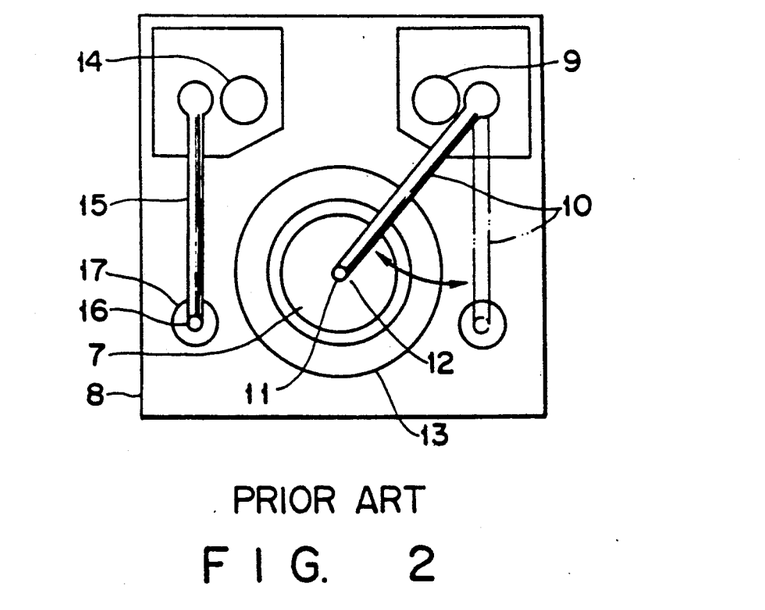
FIG. 2 is a plan view schematically showing a prior art coating apparatus of another type.

FIG. 2 shows another prior art coating apparatus. In the apparatus of this type, cup 13 having a wafer chuck (not shown) is disposed substantially in the center of base 8, and first and second arms 10 and 15 are arranged on either side of cup 13. One end portion of each arm is supported by means of a pivot, which is coupled to the driving shaft of motor 9 or 14 by means of a gear or a belt. First and second nozzles 11 and 16 are attached to the other end portions (distal end portions) of first and second arms 10 and 15, respectively. Resist reservoirs 12 and 17 are disposed under the distal ends of nozzles 11 and 16, respectively, whereby the resist in each nozzle is prevented from being dried.

In this conventional coating apparatus, one of nozzles 11 and 16 is alternatively selected. If first nozzle 11 is selected for use, for example, arm 10 is rocked around its pivot so that nozzle 11 is situated directly over the center position of semiconductor wafer 7. Then, a predetermined amount of resist is dripped from nozzle 11 onto wafer 7, and the wafer is rotated to disperse the resist uniformly over the whole surface of the wafer.

In the coating apparatus of this type, however, the nozzle operating mechanism is increased size and complicated in construction as the number of nozzles increase. If the nozzles increase in number, moreover, the arms interfere with each other, so that reliable operation cannot be ensured.

The liquid passage of each liquid supply nozzle has a special shape such that air bubbles are prevented from being produced in the liquid, in order to keep the amount of liquid dripped onto the semiconductor wafer constant. Since the liquid temperature also influences the thickness of a coating film, the liquid in the nozzles sometimes may be adjusted to a suitable temperature.

The conventional nozzle contains therein a tube made of fluoroethylene resin, e.g., PFA (tetrafluoroethylene resin) or PTFE (soft tetrafluoroethylene resin), and the distal end portion of the resin tube is used as a liquid supply passage.

In the conventional nozzle, however, the resist adheres to a thick-walled portion of the distal end portion of the tube, and it dries and solidifies, thus narrowing a liquid supply port, so that the amount of dripped liquid varies.

While handling the semiconductor wafer or in replacing the cup of the coating apparatus, furthermore, the nozzle may run against the wafer, cup, or other members, to be deformed or broken thereby. If the nozzle is damaged in this manner, its replacement, mounting, and adjustment require a lot of time, since the nozzle is a tube which constitutes part of pipe arrangement.

Figure 3:
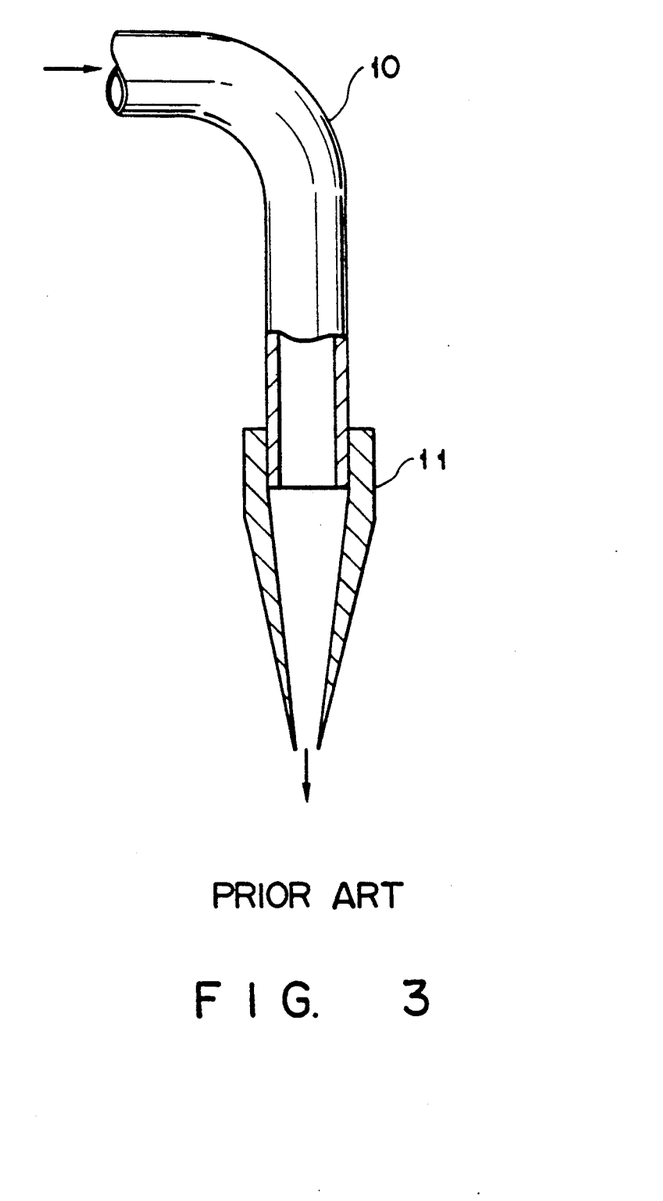
FIG. 3 is a partial longitudinal sectional view, partially in section, showing the distal end portion of a prior art liquid dripping nozzle.

In order to solve these problems of the conventional nozzle, an improved nozzle has been developed in which nozzle tip 11 for liquid discharge is attached to the distal end portion of stainless-steel tube 10, as shown in FIG. 3, so that a liquid is dripped through tip 11. Since the distal end portion of tip 11 is thin-walled, the liquid can never adhere to the tip end. Nozzle tip 11 may be formed of a tube of fluoroethylene resin, such as tetrafluoroethylene resin (PFA) or trifluorochlorethylene resin (PCTFE), for example.

In the prior art nozzle described above, however, tube 10 is made of stainless steel, so that air bubbles in the tube cannot be visually observed. Since nozzle tip 11 is attached to the distal end of tube 10 by press fit, moreover, the press-fit portion will be deteriorated after prolonged use. Air may penetrate the liquid passage through the loosened press-fit portion, thus producing air bubbles.

SUMMARY OF THE INVENTION

An object of the present invention is to provide a coating apparatus, capable of supplying a desired amount of liquid of a required type onto a semiconductor wafer, without unexpectedly dropping the liquid thereon, by means of only a required nozzle selected among liquid dripping nozzles of a plurality of types.

Another object of the present invention is to provide liquid supplying nozzles for a coating apparatus, capable of preventing air bubbles from being produced in the liquid, in order to obtain a liquid film with a uniform thickness, without entailing uneven coating.

According to an aspect of the present invention, there is provided a coating apparatus for applying a liquid to a subject, comprising: liquid supply means including a plurality of nozzle members each adapted to supply a different liquid supplied from a liquid source, onto the subject; a vessel in which the nozzle members is kept on stand-by, while maintaining the liquids in a predetermined state in the vicinity of liquid discharge port portions of the nozzle member, when the nozzle member need not be operated; and nozzle operating means for selecting at least one of said nozzle members, among other nozzle member kept on standby in the vessel, and transporting the selected nozzle member to the location of the subject, whereby the liquids are applied to the subject by means of only said selected nozzle member transported by the nozzle operating means.

The nozzle operating means preferably includes an XYZ-axis shift mechanism for moving the liquid discharge port portion straight in the directions of X-, Y-, and Z-axes.

Further, the nozzle operating means preferably includes a multi-joint arm member for moving the liquid discharge port portion within the XY-plane.

Furthermore, the nozzle operating means preferably includes a pair of rockable nozzle retaining members.

Preferably, the liquid discharge port portion of each nozzle member can be attached to and detached from a liquid supply passage connecting with the liquid source.

A seal ring member is preferably disposed between the liquid discharge port portion of each nozzle member and the liquid supply passage.

In this case, the seal ring member is formed of a resin softer than the material of the liquid supply passage and the liquid discharge port portion. For example, the ring member is made of soft tetrafluoroethylene resin.

Each nozzle member preferably includes a holder member through which is circulated heat-regulating water for adjusting the liquid temperature.

Preferably, furthermore, the liquid discharge port portion of each nozzle member is spread in the shape of a trumpet at the opening of a liquid discharge passage.

DETAILED DESCRIPTION OF THE PREFERRED EMBODIMENTS

Various embodiments of a coating apparatus according to the present invention, adapted for use in a process of resist coating, will now be described with reference to the accompanying drawings.

Figure 4:
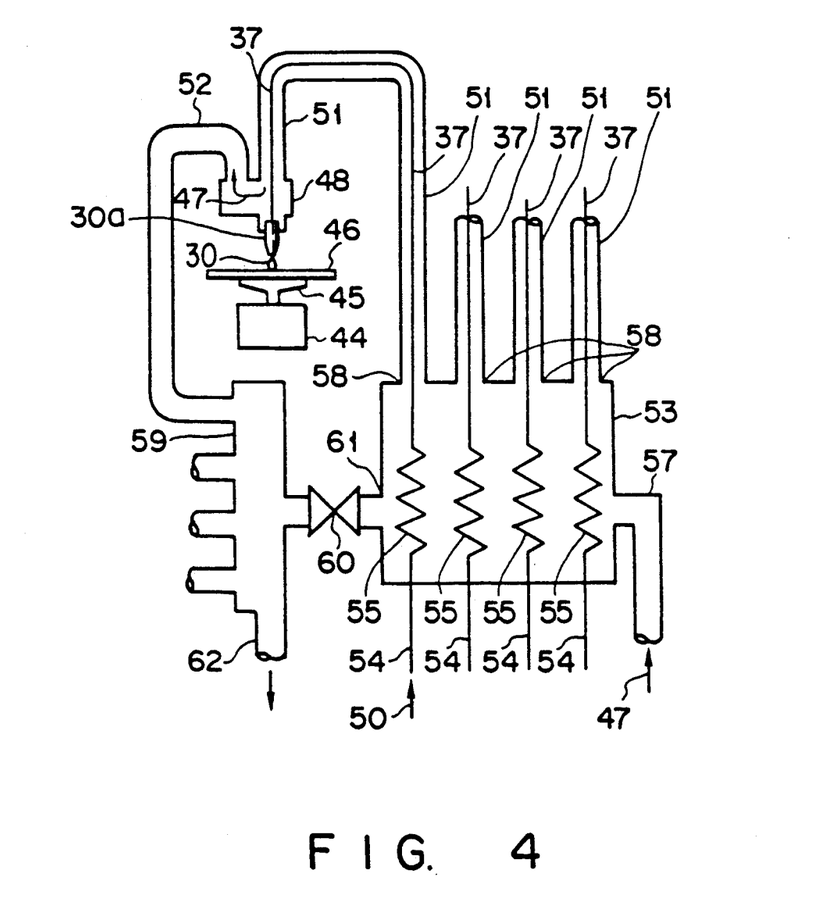
FIG. 4 is a diagram showing an outline of a coating apparatus according to an embodiment of the present invention, in which a liquid flow in the apparatus is illustrated; .

As shown in FIG. 4, semiconductor wafer 46 is held by suction by means of wafer chuck 45, and nozzle 30 for resist dripping is opposed to the upper surface of wafer 46. Chuck 45 is supported by motor 44 for rotation around a vertical axis. The rotational speed and rotation time of motor 44 are controlled by means of a controller of a computer system.

Nozzle 30 is held by means of holder 48. One end of each of hoses 51 is connected to the heat-regulating water inlet inside holder 48, while one end of each of hoses 52 is connected to a heat-regulating water outlet. The other end of each hose 51 is connected to its corresponding outlet 58 of heat regulator 53, while the other end of each hose 52 is connected to manifold 59. Manifold 59 includes valve 60 and drain 62. Manifold 59 and regulator 53 communicate with each other by means of valve 60 so that heat-regulating water 47 can be returned to regulator 53. Some of water 47 in manifold 59 is discharged through drain 62.

Heat regulator 53 is provided with four liquid supply systems. Each supply system is composed of nozzle 30, liquid supply tubes 37 and 54, and heat exchanger 55. Tube 37 is housed in each corresponding hose 51.

Figure 5:
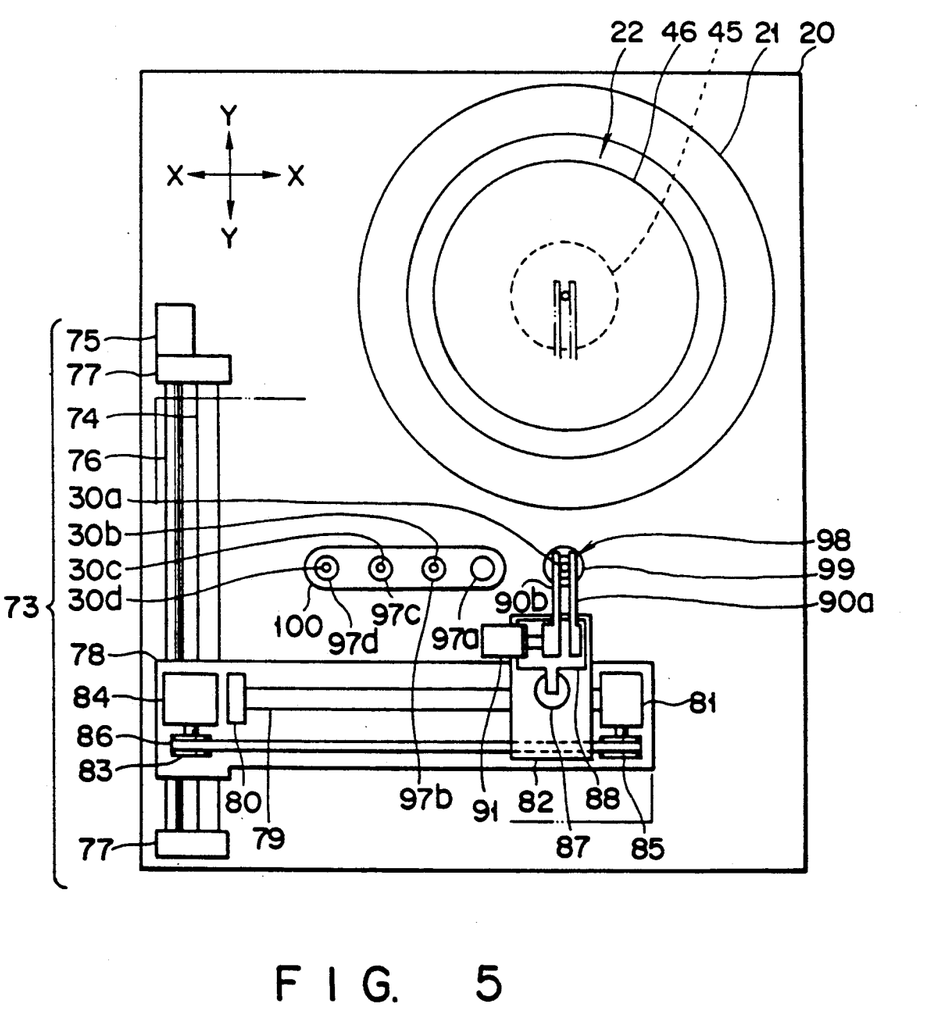
FIG. 5 is a plan view schematically showing a coating apparatus according to the embodiment of the invention.

As shown in FIG. 5, wafer chuck 45 and nozzle operating mechanism 73 are provided on base 20. Cup 21 is arranged so as to surround semiconductor wafer 46 on chuck 45. It serves to prevent a liquid centrifugally separated from wafer 46 from scattering in all directions. Formed above cup 21, moreover, is opening 22 through which semiconductor wafer 46 is loaded into or taken out of the coating apparatus.

Nozzle operating mechanism 73 is located adjacent to cup 21. It includes a pair of nozzle retaining members 90a and 90b, a mechanism for individually moving members 90a and 90b along X-, Y-, and Z-axes, and nozzle stand-by vessel 100 for keeping four nozzles 30a, 30b, 30c and 30d on stand-by when the nozzles need not be operated.

Nozzle retaining members 90a and 90b are mounted on moving plate 88, which is set on moving table 82. Member 90b, which is coupled to a piston rod of air cylinder 91, is moved along the X-axis. Thus, the distance between members 90a and 90b varies, so that the two nozzle retaining members can be operated like a pair of tweezers to hold each nozzle.

Moving plate 88, which is coupled to a piston rod of air cylinder 87, is moved up and down along the Z-axis.

Moving table 82, which is coupled to part of belt 86, is guided in the X-axis direction along guide rail 79.

Support members 80 and 81 are arranged individually at two opposite ends of guide rail 79, which is supported on moving table 78. Motor 84 is disposed on table 78, and pulley 83 is fitted on the drive shaft of motor 84. Pulley 85 is attached to support member 81. Belt 86 is paused around and between pulleys 83 and 85.

Moving table; 78 is coupled, by means of a nut (not shown), to ball screw 76 which is rotated by means of motor 75. Table 78 is guided in the Y-axis direction along guide rail 74. Rail 74 and screw 76 are supported, at their respective opposite end portions, on base 20 by means of a pair of support members 77.

Nozzle stand-by vessel 100 is disposed between wafer chuck 45 and nozzle operating mechanism 73. Four openings 97a, 97b, 97c and 97d are formed in the top face of vessel 100. These openings are arranged along the X-axis, and the respective distal end portions of nozzles 30a, 30b, 30c and 30d are inserted into vessel 100 through their corresponding openings.

Figure 6:
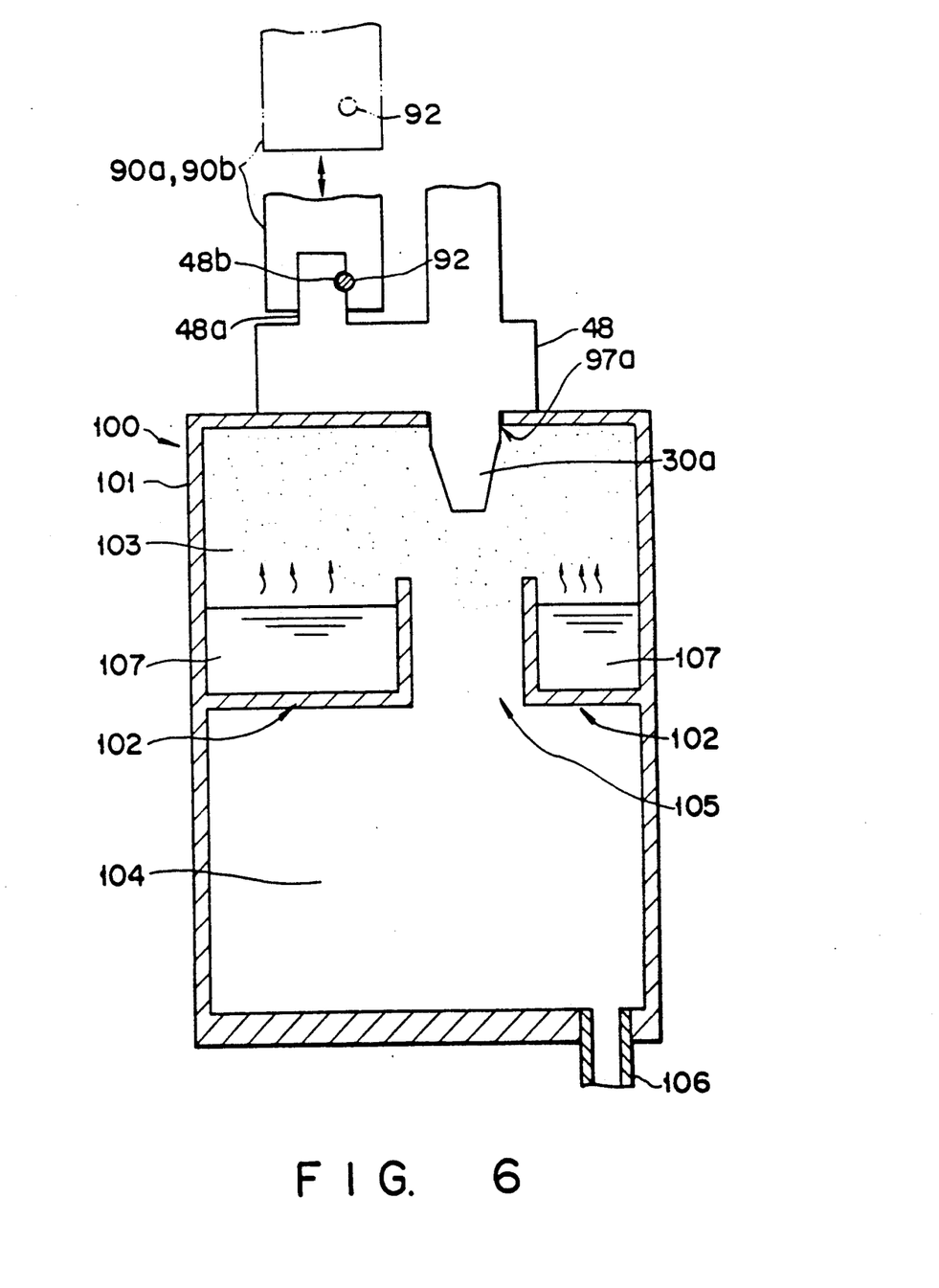
FIG. 6 is a longitudinal sectional view showing the interior of a nozzle stand-by vessel of the coating apparatus according to the embodiment.

Referring now to FIG. 6, nozzle stand-by vessel 100 will be described in detail.

Solvent bath 102 for reserving solvent (e.g., thinner) is disposed in the middle portion of the interior of body 101 of vessel 100, and upper chamber 103 of vessel 100 is filled with vapor of organic solvent 107 in bath 102. Bath 102 has opening 105 through which upper and lower chambers 103 and 104 of the vessel communicate with each other. Opening 105 is formed under openings 97a to 97d for nozzle insertion. The nozzles 30a to 30d in their stand-by state are located within a volatile atmosphere of the organic solvent 107 and, while a treating solution such as a resist solution is prevented from being dried, a liquid drop or drops from the nozzle fall into a lower chamber 104 via an opening 105 and hence are discharged via a drain 106.

Figure 7:
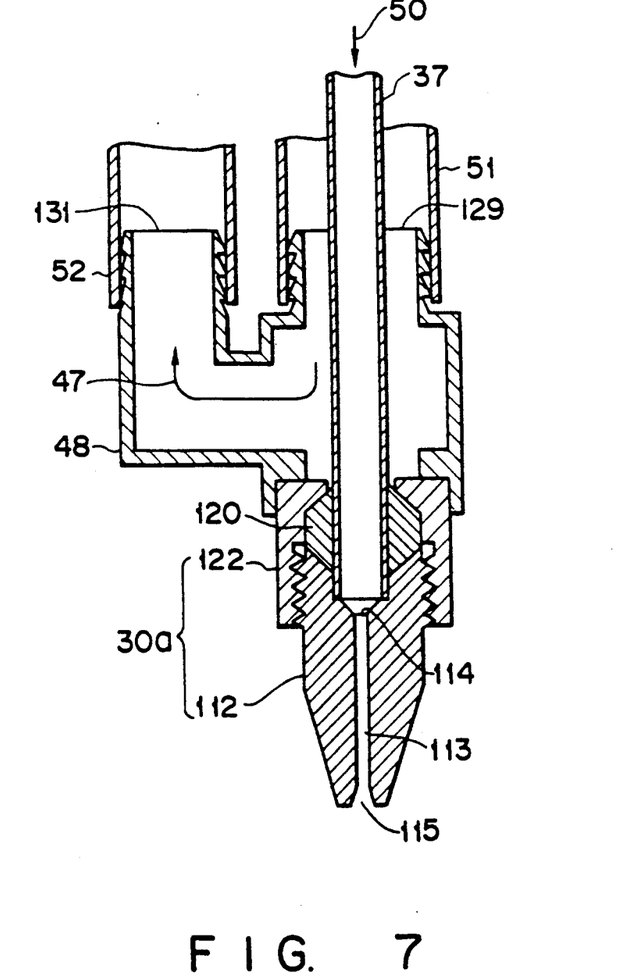
FIG. 7 is a longitudinal sectional view showing a nozzle of the coating apparatus according to the embodiment.
Figure 8:
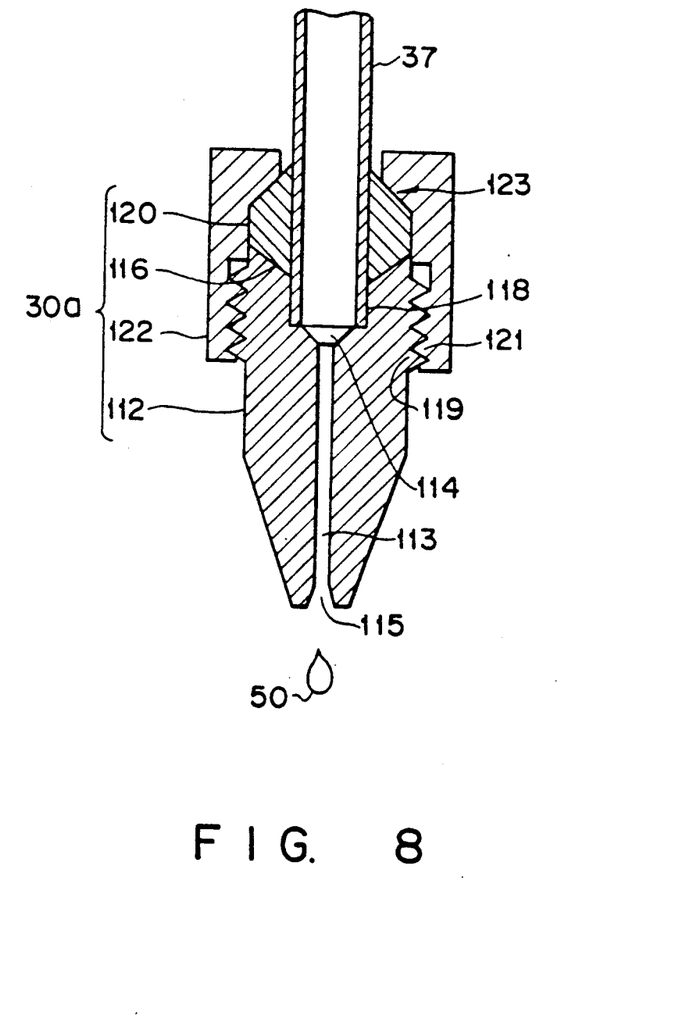
FIG. 8 is an enlarged longitudinal sectional view showing the distal end portion of the nozzle of the coating apparatus according to the embodiment.

Referring now to FIGS. 7 and 8, the nozzles for liquid dripping will be described. Since the four nozzles have substantially the same construction, first nozzle 30a will be described on behalf of the other nozzles.

As shown in FIG. 7, nozzle 30a is attached to the bottom portion of hollow holder 48. Two hose joints 129 and 131 are formed on the top portion of holder 48. Hoses 51 and 52 are connected to joints 129 and 131, respectively.

As shown in FIG. 4, the upper-course end of hose 51 is connected to water supply port 58 of heat regulator 53, while the lower-course end of hose 52 is connected to the inlet of manifold 59. Thus, heat-regulating water 47 flows into holder 48 through hose 51, and flows out of holder 48 through hose 52. Liquid supply tube 37 is passed through hose 51, and the temperature of resist 50 in tube 37 is controlled by means of water 47.

As shown in FIG. 8, nozzle tip 112 is attached to the distal end portion of nozzle 30. Male screw 119, which is formed on the proximal end portion of tip 112, is threadedly engaged with female screw 121 of nut 122. Seal ring 120 is interposed between nut 122 and liquid supply tube 37. Top taper surface 123 of ring 120 and a taper surface of nut 122 engage each other. As nozzle tip 112 is screwed into nut 122, seal ring 120 is pressed against the outer peripheral wall of tube 37, so that the gap between nut 12 and tube 37 is sealed by ring 120.

Liquid inlet portion 114 of nozzle tip 112 is drawn to the side of liquid discharge port 115, with respect to tube 37, and is formed with taper portion 116. Port 115 is trumpet-shaped so that liquid 50 is prevented from dropping while the nozzles are on stand-by. Preferably, in this case, the wall portion of tip 112 corresponding to discharge port 115 is knife-edged.

Liquid supply tube 37 and seal ring 120 are formed of tetrafluoroethylene resin (PFA) and soft tetrafluoroethylene resin (PTFE), respectively.

Referring now to FIGS. 4 to 6, there will be described the way first nozzle 30a is taken out of vessel 100 to apply the resist to semiconductor wafer 46.

(1) Untreated semiconductor wafer 46 is fed through opening 22 into cup 21 by means of a transportation mechanism (not shown), and is then mounted on wafer chuck 45. Chuck 45 retains wafer 46 by suction.

(2) When the setting of wafer 46 is finished, an operation start signal is transmitted from the computer system (not shown) to nozzle operating mechanism 73, so that mechanism 73 starts operation. In this case, the computer system is previously stored with programming data for mechanism to select first nozzle 30a for high-resolution resist dripping.

(3) Based on the computer control, screw 76 is rotated by means of motor 75 so that moving table 78 is retreated in the Y-axis direction. Thus, nozzle retaining members 90a and 90b are moved away from the position of wafer chuck 45.

(4) Then belt 86 is driven by means of motor 84 so that moving table 82 is moved in the X-axis direction. Thus, nozzle retaining members 90a and 90b are situated close to the region over first nozzle 30a of nozzle stand-by vessel 100. The first nozzle 30a is selected by computer program.

(5) Air cylinder 91 is actuated to move nozzle retaining member 90b away from the member 90a (opening operation for members 90a and 90b).

(6) Moving table 78 is advanced in the Y-axis direction so that retaining members 90a and 90b are situated directly over nozzle 30a within the XY-plane.

(7) Moving plate 88 is lowered by means of cylinder 87, and is stopped at the position where first nozzle 30a is situated between retaining members 90a and 90b.

(8) Retaining members 90a and 90b are closed by means of cylinder 91 so that first nozzle 30a is held between members 90a and 90b.

(9) Moving plate 88 is raised by means of cylinder 87, thereby lifting first nozzle 30a off vessel 100, and is then stopped at a predetermined height.

(10) Subsequently, moving table 78 is retreate in the Y-axis direction by the drive of motor 75, and moving table 82 is then moved in the X-axis direction by the drive of motor 84. With retaining members 90a and 90b held in this manner, first nozzle 30a is situated on the center line of semiconductor wafer 46.

(11) Moving table 78 is advanced in the Y-axis direction by the drive of motor 75 so that first nozzle 30a is situated directly over the center position of semiconductor wafer 46.

(12) Moving plate 88 is lowered by the drive of cylinder 87 so that first nozzle 30a is brought close to semiconductor wafer 46. When the distance from liquid discharge port 115 of nozzle 30a to the upper surface of wafer 46 is reduced to a predetermined value, plate 88 is stopped.

(13) Referring now to FIG. 4, a process for supplying resist 50 to first nozzle 30a will be described.

Resist 50 fed through a valve (not shown) of a liquid tank (not shown) and a suck-back valve (not shown), flows into heat regulator 53 via inlets 54. In regulator 53, resist 50 is adjusted to a predetermined temperature by heat exchangers 55. Each exchanger 55 is formed of a metal tube which ensures high effectiveness of heat exchange.

Subsequently, resist 50 flows into tubes 37 through outlets 58 of heat regulator 53, and a predetermined amount of resist 50 is pushed out through liquid discharge port 115 of nozzle 30a. The pushed-out resist fall in drops onto the center position of semiconductor wafer 46.

(14) Wafer chuck 45 is rotated by means of motor 44 at a predetermined speed ranging, e.g., from 1,000 to 6,000 rpm. Thereupon, the dropped resist is dispersed over the whole surface of semiconductor wafer 46, thus forming a resist coating layer with a predetermined thickness thereon.

(15) When the resist coating is finished, processes (3) to (12) are reversely followed, so that first nozzle 30a is returned to opening 97a of vessel 100, and nozzle retaining members 90a and 90b are kept on stand-by at a predetermined position.

(16) After nozzle 30a is returned to the stand-by position, semiconductor wafer 46 is released from the suctional hold of wafer chuck 45, and is then carried out of the coating apparatus by means of a handling device (not shown).

(17) If a developing solution is to be applied thereafter to semiconductor wafer 46, the wafer is held by means of wafer chuck 45 after having being exposed to light. In this case, a predetermined amount of developer is applied to wafer 46 after transporting a nozzle, e.g., fourth nozzle 30d, to the region directly over the center position of wafer 46 by means of nozzle operating mechanism 73.

According to the first embodiment described above, only one of the nozzles is selected depending on the process and the wafer type, and is transported to the region over the wafer, while the other nozzles are kept on stand-by in the vessel 100. Thus, the liquid can be prevented from being unexpectedly dropped onto the semiconductor wafer, so that uneven coating can be prevented.

Nozzle tips 112 and 122 are formed of stainless steel or high-strength resin, such as trifluorochlorethylene resin (PCTFE). In this case, the PCTFE, which is high in both hardness and working accuracy, ensures high stability in shape of liquid discharge port 115, and is fit to press soft seal ring 120.

Even if a resin tube, which generally lacks in shape stability, is used as tube 37, moreover, a liquid-tight state can be established and maintained as seal ring 120 is deformed. Thus, the sealing effect is reliable as a whole.

Further, tube 37 and tip 112 can be securely brought into intimate contact with each other without difficulty, and the tip, if broken, can be easily removed for replacement.

Furthermore, discharged liquid passage 113 of the nozzle is not provided with any indentation which is liable to cause stagnant liquid pools or air bubbles, and the respective inner surfaces of tube 37 and tip 112 are continuous with each other. Thus, there is no possibility of liquid pools or air bubbles being produced, so that stable discharge can be enjoyed.

Figure 9:
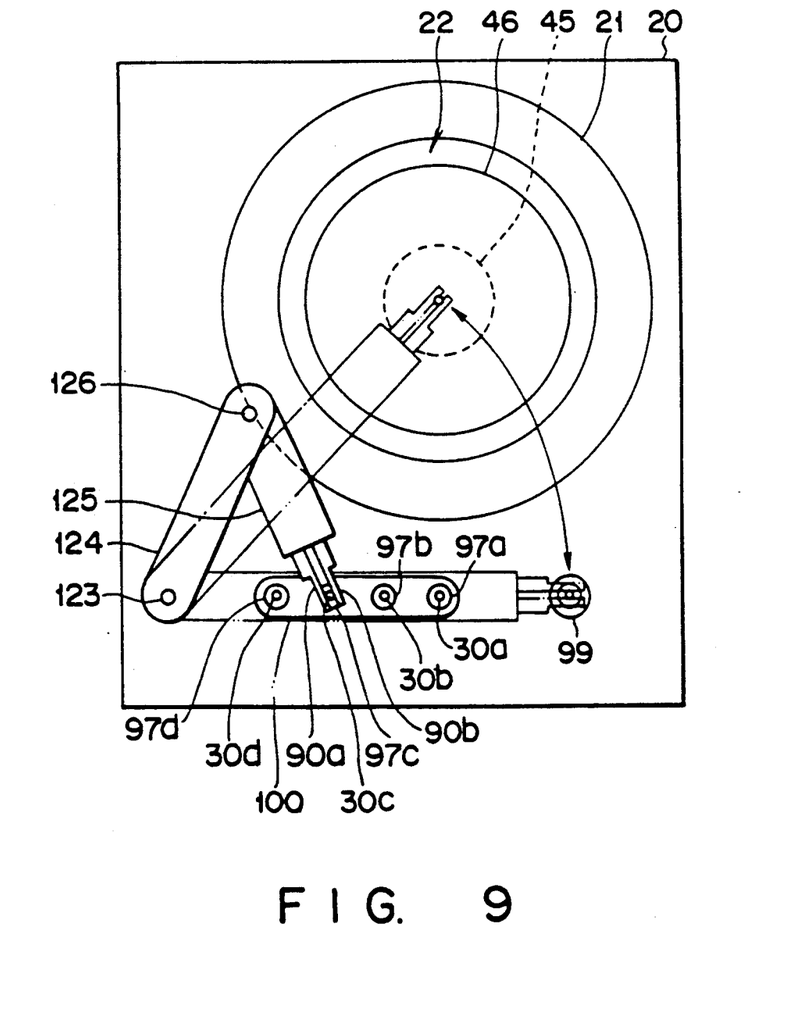
FIG. 9 is a plan view schematically showing a coating apparatus according to a second embodiment of the present invention.

Referring now to FIG. 9, a second embodiment of the present invention will be described. A description and illustration of those portions which are used in common in the first and second embodiments are omitted.

In a coating apparatus according to this second embodiment, the nozzle operating mechanism is modified. Fixed shaft 123 is fixed on base 20 so that first arm 124 is rockable around shaft 123. Shaft 123, which is coupled to the drive shaft of a motor (not shown), is situated on an extension of the longitudinal axis of nozzle stand-by vessel 100.

Second arm 125 is coupled to first arm 124 by means of shaft 126. Thus, arms 124 and 125 constitute a multi-joint arm or the nozzle operating mechanism. Nozzle retaining members 90a and 90b are attached to the distal end of the multi-joint arm. The multi-joint arm can be bent around fixed shaft 123, as illustrated, so that members 90a and 90b at the distal end of the arm can be situated at each nozzle retaining position.

In the apparatus of the second embodiment described above, first arm 124 is rocked through a predetermined angle around fixed shaft 123 so that third nozzle 30c is held between retaining members 90a and 90b. In this state, nozzle 30c is transported to the region directly over the cetner position of semiconductor wafer 46, and a predetermined amount of resist is dripped onto the wafer.

According to the second embodiment described above, the nozzle operating mechanism mounted on the base can be reduced in size.

In the above embodiment, moreover, one nozzle is selected among four nozzles. The present invention is not, however, limited to this arragnement, and one or two nozzles may be selected among two, three, five, or more nozzles.

According to the coating apparatus and the nozzles of the present invention, as described herein, a required amount of liquid can be securely uneven coating. Thus, the reliability of coating processes and the production efficiency for semiconuctor wafers can be improved.

What is claimed is:

1. A treatment method for applying a number of liquids to a semiconductor wafer in a clean atmosphere, said liquids containing a solvent for coating, recoating or developing the surface of the object, comprising the steps of:

providing a plurality of liquid supply passages in connection with nozzle means, each of which stands by at a home position in a solvent atmosphere containing substantially the same solvent as contained in the liquid when said nozzle means is not used, said nozzle means being adapted to supply different kinds of liquids or a single kind of liquid, and said home position being located at a position other than at least an upper region of the wafer;

selecting one from said plurality of nozzle means, which corresponds to the kind of liquid to be supplied to the wafer;

picking up said selected nozzle means from the solvent atmosphere;

conveying the selecting nozzle means to a position above the wafer from the home position;

supplying liquid to the liquid supply passages of said selected nozzle means after rotating the wafer, or rotating the wafer after supplying the liquid to the liquid supply passages of said selected nozzle means; and returning said selected nozzle means to said home position immediately after applying the liquid to the wafer.

2. The method according to claim 1, wherein said liquid is a resist liquid or a developing liquid.

3. The method according to claim 1, wherein said nozzle means includes a holder member through which heat-regulating water is circulated to adjust the liquid temperature.

4. The method according to claim 1, wherein said plurality of nozzle means provided in the solvent atmopshere are arrayed in a row in an XY-plane.

5. The method according ot claim 1, wherein said selected nozzle means is conveyed in an X-direction and then in a Y-direction, thus locating the selected nozzle means above the wafer.

6. The method according to claim 1, wherein said liquid is dripped onto the wafer through said selected nozzle means.

* * * * *